United States Patent [19]

Jabloner et al.

[11] Patent Number: 4,656,207
[45] Date of Patent: Apr. 7, 1987

[54] EPOXY THERMOSETS HAVING IMPROVED TOUGHNESS

[75] Inventors: Harold Jabloner; Brian J. Swetlin; Sung G. Chu, all of Wilmington, Del.

[73] Assignee: Hercules Incorporated, Wilmington, Del.

[21] Appl. No.: 702,518

[22] Filed: Feb. 19, 1985

[51] Int. Cl.$^4$ .................... C08L 63/00; C08K 3/04; C08G 59/50
[52] U.S. Cl. ........................... 523/400; 428/209; 428/901; 523/445; 523/458; 523/466; 523/468; 525/113; 525/389; 525/396; 525/415; 525/423; 525/438; 525/468; 525/504; 525/523; 525/525; 525/526; 525/906; 528/90; 528/93; 528/109; 528/119; 528/129; 528/315
[58] Field of Search ............... 523/400, 445, 458, 466, 523/468; 525/113, 389, 396, 407, 415, 421, 423, 438, 468, 490, 504, 523, 525, 526, 906; 528/90, 93, 109, 119, 129, 315, 430; 428/209, 901

[56] References Cited

U.S. PATENT DOCUMENTS

| | | | |
|---|---|---|---|
| 3,920,768 | 11/1975 | Kwiatkowski | 525/421 |
| 3,950,451 | 4/1976 | Suzuki et al. | 525/490 |
| 4,330,659 | 5/1982 | King et al. | 528/99 |
| 4,430,473 | 2/1984 | Brode et al. | 528/154 |

FOREIGN PATENT DOCUMENTS

| | | |
|---|---|---|
| 153823 | 6/1974 | Czechoslovakia . |
| 0126494 | 11/1984 | European Pat. Off. . |
| 0127198 | 12/1984 | European Pat. Off. . |
| 0130270 | 1/1985 | European Pat. Off. . |
| 2427910 | 1/1980 | France . |
| 53-98400 | 8/1978 | Japan . |
| 54-64599 | 5/1979 | Japan . |
| 57-14889 | 8/1983 | Japan . |
| 1306231 | 2/1973 | United Kingdom . |

OTHER PUBLICATIONS

Sergeyev et al, Vysokomol Soyed A25 No. 6 1311–1315, 1983.

Development of Resins for Damage Tolerant Composites—A Systematic Approach, 29th National Sampe Symposium, Apr. 3–5, 1984, 422–436, Diamont and Moulton.

Addition of Polyethersulphone to Epoxy Resins—The British Polymer Journal, 15, 71–75 (1983).

Phase Separation in Epoxy Resins Containing Polyethersulphone—Bucknall and Partridge, Polymer, 24, 639–646 (1983).

Deformation and Fracture Behaviour of a Rubber-Toughened Epoxy: 1. Microstructure and Fracture Studies, Polymer, 24, 1341–1354 (1983), Kinloch, Shaw, Tod, and Hunston.

High Temperature Polymers, I-Sulfone Ether Diamines as Intermediates for Tractable High Temperature Polymers, Journal of Polymer Science, 12, 565–573 (1974), Kawakami, Kwiatkowski, Brode and Bedwin.

*Primary Examiner*—Herbert J. Lilling
*Attorney, Agent, or Firm*—Edmund C. Ross, Jr.

[57] ABSTRACT

Disclosed is a stiff, tough thermoset composite, the composite comprising a crosslinked epoxy resin matrix and high strength filaments. The resin matrix comprises a glassy discontinuous phase dispersed in a glassy continuous phase that continues throughout the resin matrix. Volume fractions of the discontinuous phase are at least about 35% of the total volume of the continuous and discontinuous phases combined in exceptionally tough composites.

Also disclosed are novel resin compositions suitable for making these thermosets.

20 Claims, 4 Drawing Figures

EPOXY THERMOSETS HAVING IMPROVED TOUGHNESS

This invention relates to epoxy thermosets, including composites thereof, and more particularly to a resin morphology in these thermosets that makes them extremely tough and stiff.

BACKGROUND OF THE INVENTION

Epoxy resins are well known for use in making advanced or high performance composites comprising high strength fiber made of glass, boron, carbon or the like. Structures made of these composites can weigh considerably less than their metal counterparts at equivalent strength and stiffness. Higher modulus epoxy composites, however, have been relatively brittle. This brittleness restricts their wider application because, for example, damage tolerance, an important property of flight critical components in aircraft, is related to brittleness of the component.

One approach in making epoxy composites tougher has been to introduce functionally terminated rubbery polymers into the epoxy resin formulations. The thermosets resulting from these formulations, while having increased toughness, have reduced modulus.

Another approach has been to incorporate engineering thermoplastics into the crosslinked epoxy matrix. Various thermoplastics have been suggested and the use of a polyethersulfone as the thermoplastic modifier for epoxy resins was studied by C. B. Bucknall et al and is discussed in the British Polymer Journal, Vol. 15, March 1983 at pages 71 to 75. Bucknall et al's studies were carried out on cured epoxy-polyethersulfone blends prepared from mixtures of trifunctional and tetrafunctional aromatic epoxides, diaminodiphenylsulfone or dicyandiamide as hardener and various amounts of Victrex 100P manufactured by ICI Ltd., said to be a relatively low molecular weight grade of polyethersulfone. The studies showed that phase separation occurred in certain of the cured epoxy-polyethersulfone blends and that some of the cured blends exhibited distinct nodular morphological features. Analyses indicated that the polyethersulfone was concentrated in the nodules and Bucknall et al surmised that the nodules were not formed by polyethersulfone alone but by a crosslinked epoxy-polyethersulfone copolymer. Bucknall et al found no clear correlation between mechanical properties such as elastic modulus, fracture toughness and creep of the cured blends and composition and concluded that the addition of polyethersulfone has little effect on the fracture toughness of the resin mixtures, irrespective of the degree of phase separation or the morphology.

SUMMARY OF THE INVENTION

Now, in accordance with this invention it has been found that epoxy thermosets which have a morphology characterized by a glassy continuous phase and a glassy discontinuous phase which constitutes at least 35% of the total volume of the phases have superior toughness and that the toughness advantage is achieved without detriment to other desirable properties associated with epoxy thermosets.

Accordingly, the present invention relates to a thermoset comprising a crosslinked epoxy resin matrix with a fracture toughness, $K_{IC}$, of at least 1.0 MPam$^{\frac{1}{2}}$, a Tg of at least 125° C. and comprising a glassy discontinuous phase dispersed in a glassy continuous phase that continues throughout said resin matrix, said discontinuous phase constituting at least about 35 volume % of the total volume of the discontinuous and continuous phases. The invention also relates to composites comprising the crosslinked epoxy resin matrix and high strength filaments.

DETAILED DESCRIPTION OF PREFERRED EMBODIMENT

Figure 1:
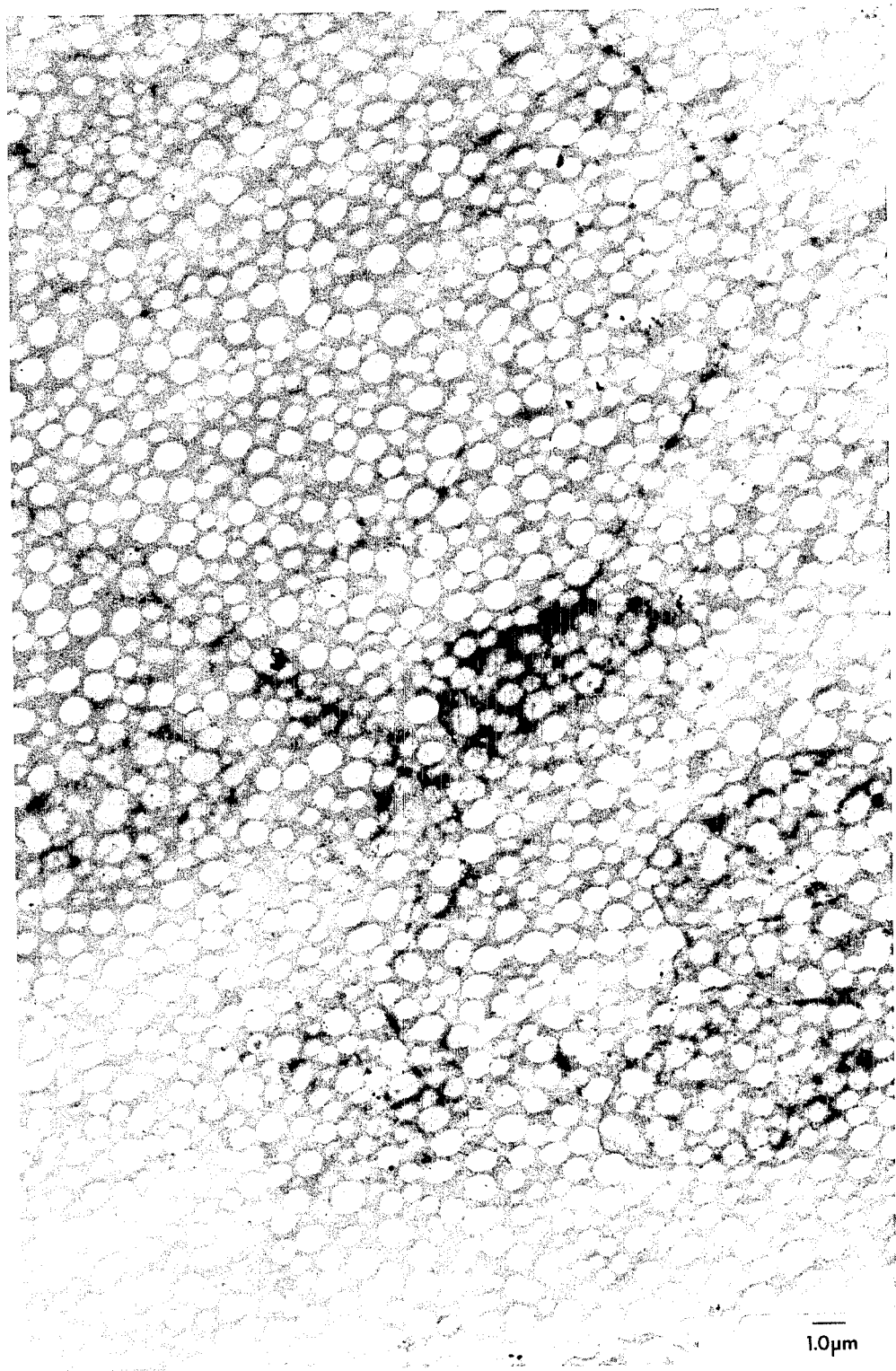
FIGS. 1 and 2 are photomicrographs of RuO$_4$ stained microtomed sections of the thermoset matrices of Example 9, Part B and Example 10, respectively. In the photomicrographs the continuous phase is the dark (electron dense) area.

The cured, i.e., crosslinked resin matrices of this invention are characterized by a morphology comprising a glassy discontinuous phase which is preferably uniformly dispersed throughout a glassy continuous phase, the glassy phases having a Tg at least 125° C. The domains of the dispersed discontinuous phase preferably are between about 0.05 and 10 microns and more preferably between 0.1 and 5 microns in largest dimension. The domains are generally spherical or ellipsoidal in shape. The cured matrices are insoluble at room temperature in conventional solvents such as jet fuel, Skydrol hydraulic fluid, acetonitrile, acetone, tetrahydrofuran, dimethylsulfoxide, dimethylformamide, toluene, methylene chloride, methylethyl ketone (2-butanone), water and the like.

The volume of the discontinuous phase constitutes at least about 35%, preferably between 35% and 65% of the total volume of the matrix resin. The total volume of the resin matrix (Vr) is defined as the volume of the continuous phase (Vc) and the volume of the discontinuous phase (Vd) combined. In determining the volume of the discontinuous phase, a micrograph of a microtomed section of the resin or composite is made and the area (or an area fraction) of the micrograph occupied by the continuous phase (Ac), discontinuous phase (Ad) and filament or fiber (Af) is determined visually or instrumentally, using commercial devices such as a digitizer or image analyzer. The volume fraction or volume percent of the discontinuous phase is directly proportional to the area fraction or percent. Exceptionally tough two phase composites usually have discontinuous phases (Ad) comprising from about 45% to 55% of the total area of the micrograph less the area of the filaments (Ac+Ad−Af).

The crosslinked resin matrices of this invention are also characterized by a Tg of at least 125° C. and a fracture toughness of at least 1.0 MPam$^{\frac{1}{2}}$. The preferred crosslinked resin matrices have a fracture toughness of 1.5 MPam$^{\frac{1}{2}}$ or greater and a cohesive fracture energy, $G_{IC}$, of a least 300 joules/meter$^2$. Addition of fiber does not affect the morphological characteristics of the resin matrix in the resulting thermoset composites. The preferred composites have a post impact compression at an impact energy of 1500 inch-pounds per inch thickness of at least about 30 and preferably at least about 35 kilopounds per square inch (ksi), as determined according to NASA publication 1092, using 32 ply quasiisotropic laminates (4"×6"; (+45°/+90°/−45°/0°)4S).

The epoxy thermosets and composites of this invention can be obtained from a thermosetting epoxy resin composition comprising (a) a polyepoxy component having a glass transition temperature below about 50° C.; (b) an epoxy hardener; and (c) an aromatic oligomer that is reactive with (a) or (b) or (a) and (b), has a molecular weight (number average) between about 2000 and 10,000, and a glass transition temperature between about 120° C. and 250° C.

The polyepoxy component contains at least 2 epoxy groups and preferably is an aromatic polyepoxy compound having between 2 and about 4 epoxy groups per molecule and a glass transition temperature below 20° C. Suitable polyepoxy compounds are resorcinol diglycidyl ether (or 1,3-bis-(2,3-epoxypropoxy)benzene) marketed, for example, by Wilmington Chemical as HELOXY® 69; diglycidyl ether of bisphenol A (or 2,2-bis[p-(2,3-epoxypropoxy)phenyl]propane); triglycidyl p-aminophenol (or 4-(2,3-epoxypropoxy)-N,N-bis-(2,3-epoxypropyl)aniline); diglycidyl ether of bromobisphenol A (or 2,2-bis[4-(2,3-epoxypropoxy)3-bromophenyl]propane; diglycidylether of Bisphenol F (or 2,2-bis[p-(2,3-epoxypropoxy)phenyl]methane); triglycidyl ether of metaaminophenol (or 3-(2,3-epoxypropoxy)N,N-bis(2,3-epoxypropyl)aniline); and tetraglycidyl methylene dianiline (or N,N,N',N'-tetra(2,3-epoxypropyl)4,4'-diaminodiphenyl methane). Combinations of two or more polyepoxy compounds can be used as the polyepoxy component.

The aromatic oligomer, as stated, contains functional groups which are reactive with the polyepoxide component and/or the epoxy hardener of the composition. In a preferred embodiment the oligomer is epoxy reactive (i.e. reacts with epoxy groups) and has at least about 1.4 epoxy reactive groups per molecule. The reactive aromatic oligomer perferably contains divalent aromatic groups such as phenylene, diphenylene or napthalene groups linked by the same or different divalent non-aromatic linking groups. Exemplary linking groups are oxy(—O—); sulfonyl(—SO$_2$—); oxyalkylene or oxyalkyleneoxy(—OR— or —ORO— wherein R is lower alkylene preferably with 1-3 carbon atoms); lower alkylene or alkylidene (—R— or —R(R$_1$)$_y$— wherein R and R$_1$ are independently lower alkylene and y is 1 or 2); ester groups such as —(R$_1$)$_x$COO(R$_2$)$_y$— wherein R$_1$ and R$_2$ are independently lower alkylene preferably with 1 to 3 carbons and x and y are independently zero or 1; and

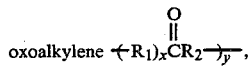

where R$_1$ and R$_2$ are independently lower alkylene where x and y are independently zero or 1. The aromatic units may be substituted with non-interferring substituents such as chlorine, lower alkyl, phenyl etc. Generally, at least twenty-five percent of the total number of carbon atoms in the reactive aromatic oligomer will be in aromatic structures, and preferably at least about 50% of the total carbon atoms are in aromatic structures.

The preferred reactive aromatic oligomers comprise polyethers and more preferably polyethers having two different types of units. A portion, preferably greater than half of these units are aromatic and more preferably are sulfone bridged diphenylene units or ketone bridged diphenylene units. The other type of unit in these preferred oligomers are aromatic or cycloaliphatic units that are not bridged (e.g., napthalene) or are bridged by groups which are essentially nonpolar, examples of which are alkylidene such as isopropylidene bridges.

The reactive aromatic oligomers preferably have reactive groups that are terminal groups on the oligomer backbone and more preferably are reactive groups at the ends of oligomeric backbones which have little or no branching. The preferred reactive groups of the reactive aromatic oligomer are primary amine(—NH$_2$), hydroxyl(—OH), carboxyl(—COOA where A is hydrogen or an alkali metal), anhydride, thio, secondary amine and epoxy. Especially preferred are reactive aromatic oligomers having at least about 1.7 reactive groups per molecule and having at least about seventy percent of the total number of reactive groups present as primary amine groups.

The preferred reactive aromatic oligomers are made, for example, by reacting a molar excess of a sulfone such as dichlorodiphenylsulfone with a dihydroxy aromatic compound or compounds such as bisphenol A or 2,7 napthalenediol so as to yield a chloro-terminated oligomer and then reacting this chloro-terminated oligomer with an alkali metal salt of a hydroxy amine compound such as para or meta aminophenol to provide the reactive groups on the ends of the oligomer. Suitable sulfones for this procedure are meta, and para dichlorodiphenylsulfones. Among the suitable dihydroxy aromatic compounds for use in this procedure are Bisphenol A, Bisphenol F, naphthalenediols and biphenyl diols. Other procedures for producing oligomers having reactive end groups are disclosed in U.S. Pat. No. 3,895,094 to Brode and Kawakami and U.S. Pat. No. 3,563,951 to Radlman and Nischk, the latter patent using a procedure which involves forming nitro terminated oligomers and then reducing the nitro groups to amines.

An advantageous route for making the preferred reactive aromatic oligomers comprises (a) dehydrating a dihydroxy aromatic compound or a combination of dihydroxy compounds with an amount of alkali metal hydroxide that provides slightly less than one equivalent of alkali metal for each equivalent of hydroxyl in the dihydroxy compound or combination thereof, the dehydrating being in the presence of an organic liquid and an alkali metal carbonate in an amount which is at least equivalent to the hydroxyl excess; (b) reacting a molar excess of dihalogen diphenylsulfone bearing about two replacable halogens per molecule with the dehydrated product of (a) in the presence of an organic solvent and an alkali metal carbonate; (c) dehydrating a phenol bearing epoxy reactive functionality such as p-aminophenol, m-aminophenol or combinations thereof with alkali metal hydroxide in an amount that provides slightly less than one alkali metal equivalent for each hydroxy equivalent in the aminophenol; and (d) reacting the dehydrated products of (c) with the condensed product of (b). Amine terminated polysulfone oligomers made in this manner have at least about 70% of the end groups amine terminated.

The glass transition temperature of the reactive aromatic oligomer preferably ranges between 140° and 220° C. A more preferred range is between 140° and 190° C. The molecular weight (number average) of the reactive aromatic oligomer preferably ranges between 2500 and 5000. Preferably, the reactive aromatic oligomer has a polydispersity ($M_w/M_n$) of between about 2.0 and 4.0 where $M_n$ is number ave molecular weight and $M_w$ is weight average molecular weight.

The epoxy hardener of the thermosetting composition is preferably an aromatic diamine such as a diaminodiphenylsulfone; a methylenedianiline such as 4,4'-methylenedianiline; a diaminodiphenylether; benzidine; 4,4'thiodianiline; 4-methoxy-6-m-phenylenediamine; 2,6-diaminopyridine; 2,4-toluenediamine; and dianisidine. Alicylic amines such as menthane diamine and heterocyclic amines such as pyridine may also be employed. In some cases aliphatic amines such as secondary alkylamines which are normally fast reacting hardeners can be used alone or in combination with other epoxy hardeners provided the concentration and/or curing temperature are sufficiently low to permit control of the curing rate. Other fast reacting hardeners which can be employed for making the epoxy resins of the invention are dicyandiamide and boron trifluoride.

Table A below provides the general and preferred ranges as, weight percent, for the polyepoxy component, reactive aromatic oligomer and hardener used to produce the crosslinked epoxy resin matrices of this invention:

TABLE A

|  | General | More Preferred |
|---|---|---|
| Epoxy Component | 25 to 60 | 30 to 55 |
| Oligomer | 25 to 50 | 30 to 45 |
| Hardener | 10 to 30 | 15 to 25 |

Other ingredients such as catalysts, modifiers, and the like can be present provided their presence and amount does not destroy the advantages of the invention. For example, the inclusion of functionally terminated elastomers such as carboxy or amine terminated butadieneacrylonitrile liquid rubbers improves peel strength and provides still another phase in the thermosets and composites of this invention.

The thermosets and composites of this invention can be produced conventionally. Preferably the polyepoxy component and the reactive aromatic oligomer are first reacted together using an amount of the polyepoxy component that ensures a resulting precursor product that has unreacted epoxy groups, the hardener is added and curing is completed. Alternatively, an admixture of the polyepoxy component and an equivalent amount of the reactive oligomer can be reacted together and additional polyepoxy component added to form the precursor product prior to the addition of hardener and curing. If desired, the polyepoxy component, epoxy hardener and reactive aromatic oligomer can be admixed in bulk and cured to provide the thermosets of this invention.

Curing of the epoxy resins of this invention usually requires a temperature of at least about 40° C., up to about 200° C. or more for periods of minutes up to hours. Post treatments can be used as well, such post treatments ordinarily being at temperatures between about 100° C. and 300° C. Preferably, curing is staged to prevent exotherms, staging preferably commencing at temperatures below about 180° C.

The epoxy resin matrices of this invention are particularly useful in composites containing high strength filaments or fibers such as carbon (graphite), glass, boron and the like. Composites containing from about 30% to about 70% (preferably about 40% to 70%) of these fibers based on the total volume of the composite are preferred in making composite structures.

A preferred manner of making the composites is by hot melt prepregging. The prepregging method is characterized by impregnating bands or fabrics of continuous fiber with the thermosetting epoxy resin composition in molten form to yield a prepreg which is layed up and cured to provide a composite of fiber and thermoset resin.

Generally, for hot melt processing it is preferred to select a polyepoxide component having a Tg below 20° C. and a reactive aromatic oligomer having amine functional groups, which, when reacted together, provide a liquid epoxy functional precursor having a viscosity of between about 10,000 and 100,000 centipoises (cps), more preferably between 30,000 and about 70,000 cps at 100° C. In hot melt prepregging the combination of polyepoxy component, reactive aromatic oligomer and hardener preferably has a viscosity below 150,000 cps at 100° C.

Other processing techniques can be used to form composites containing the epoxy resin thermosets of this invention. For example, filament winding, solvent prepregging and pultrusion are typical processing techniques in which the uncured epoxy resin can be used. Moreover, fibers in the form of bundles can be coated with the uncured epoxy resin composition, layed up as by filament winding and cured to form the composites of this invention.

The epoxy resin matrices and composites of this invention are particularly useful as adhesives and as structures for the aerospace industry and as circuit boards and the like for the electronics industry.

Figure 3A:
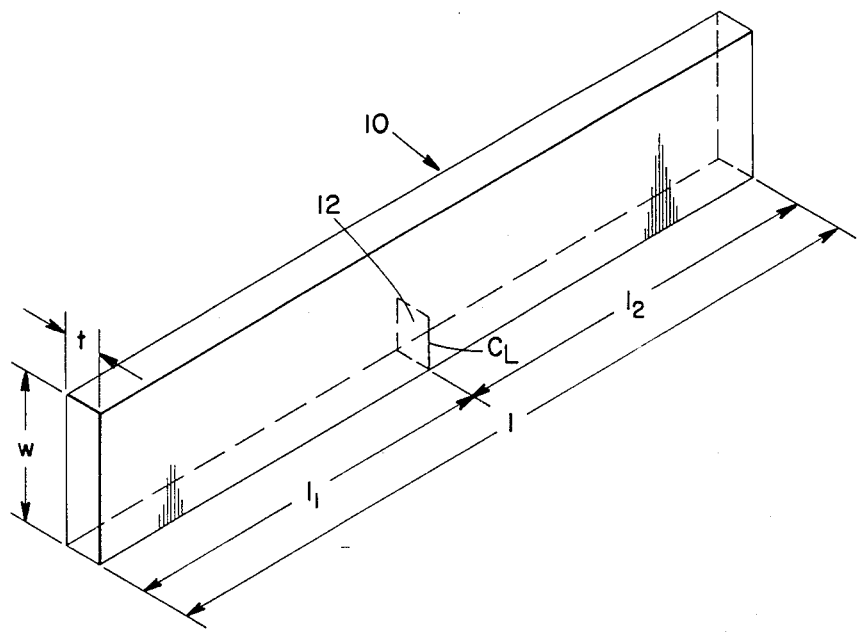
FIGS. 3(a) and 3(b) illustrate the test specimens used in determining fracture energy ($G_{IC}$) and fracture toughness ($K_{IC}$) of thermosets of this invention.
Figure 3B:
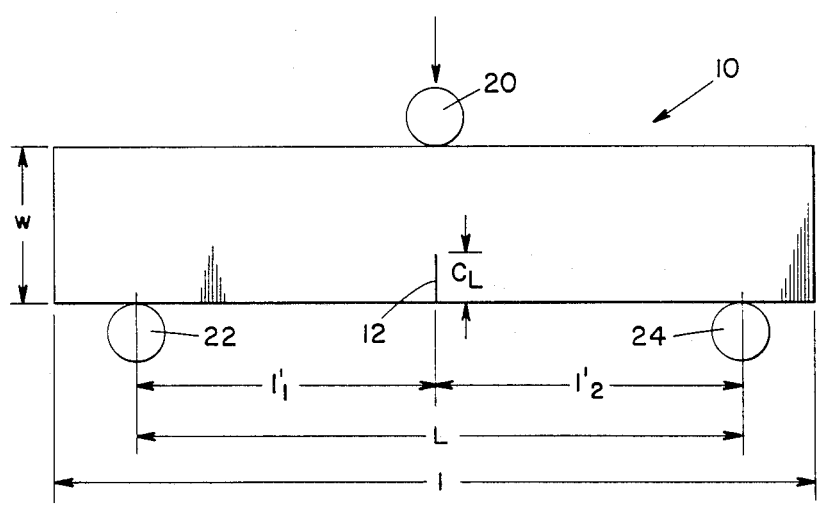

The following test procedures were employed in determining fracture energies ($G_{IC}$) and critical stress intensity factors ($K_{IC}$) in accordance with this invention. The mechanical strength of the thermoset resins was quantified in terms of the mode I cohesive fracture energy, $G_{IC}$ in joules/meter$^2$ (J/m$^2$) or the mode I critical stress intensity factor, $K_{IC}$ in megapascals (MPa) times meters (m) to the one half power (MPam$^{\frac{1}{2}}$). The two are related through the following well known relationship which may be found in *Fundamentals of Fracture Mechanics* by J. F. Knott, Buttersworth, London (1973).

$$K_{IC} = (G_{IC}E)^{\frac{1}{2}}$$

where E is Young's modulus, determined in accordance with ASTM D638. $G_{IC}$ or $K_{IC}$ can be quantified via numerous test methods such as compact tension, double cantilever beam, double torsion and single edge notch. The thermoset resins were tested herein using a single edge notch geometry loaded in three point bending as described in *Fracture of Engineering Brittle Materials*, Ayal de S. Jayatilaka, Applied Science Publishers Ltd., London (1979). In carrying out the test, the resin was cast in the form of a 6 inch×7 inch×0.125 inch sheet which was then milled to yield a number of rectangular prisms, one of which is shown in FIG. 3(a) as prism 10, where L is 2.5 inches, w is 0.5 inch and t is 0.125 inch. An edge crack 12 was made in each rectangular prism, special care being taken to insure that the crack plane was perpendicular to the prism's long axis. The crack length $C_L$ was in the range of 0.12 inch to 0.22 inch, distances $l_1$ and $l_2$ each being one and one fourth (1¼) inch. Edge crack 12 was made by slicing the prism with a razor blade at a temperature about 40° C. above the resin Ig. Specifically, a prism of the above dimensions was fixedly clamped and passed over a stationary razor blade. The cutting edge of the blade was positioned in the prism thickness-width plane and at an oblique angle to the horizontal. The clamped prism was placed in a large oven and conditioned for about 15 minutes at a temperature about 40° C. above the thermoset's Ig. The edge crack 12 was then made by passing the clamped prism over the stationary razor blade. The prism was then cooled to room temperature and placed in another device which contained cavities similar in size to the prism dimensions. The device containing the cracked prism was placed in an oven and conditioned about 15 minutes at a temperature about 40° C. above the thermoset's Ig. The temperature was then decreased to about 22° C. at a nominal rate of 1° C./min. The cracked specimens prepared as discussed above were then loaded in three point bending as shown in the FIG. 3(b) using an INSTRON® Model 1125 and tested at a crosshead displacement rate of 0.05 inch/min at a temperature of about 22° C. Crossbar 20 in FIG. 3(b) acted as the crosshead against stationary crossbars 22 and 24 which were respectively distances $l_1'$ and $l_2'$ from crack 12. The distance $l_1'$ and $l_2'$ were each 2.54 centimeters. Distance L was 5.08 centimeters, t was 0.3175 centimeter and w was 1.27 centimeters. At critical load, $P_c$, the crack began to propagate and the test was terminated. The following formula was used to calculate a critical stress intensity factor, $K_{IC}$.

$$K_{IC} = \frac{3 P_c L c^{\frac{1}{2}}}{2 t w^2} \left[ 1.93 - 3.07 \left(\frac{c}{w}\right) + 14.53 \left(\frac{c}{w}\right)^2 - 25.1 \left(\frac{c}{w}\right)^3 + 25.8 \left(\frac{c}{w}\right)^4 \right]$$

where $P_c$ is the load in newtons at which crack growth initiated; w is the width, 0.0127 meter; L is the span, 0.0508 meters; t is the thickness, 0.003175 meters; and c is the crack length, in meters.

Five (sometimes more) tests were made and the sample mean and standard deviation determined. $G_{IC}$ was then calculated using the previously shown relationship between $G_{IC}$ and $K_{IC}$. The modulus, E was calculated from the shear storage modulus, $G'(\omega)$ assuming Poisson's ratio to be 0.35 $G'(\omega)$ was determined at $\omega = 10$ rad/sec and about 22° C. With a Rheometrics Mechanical Spectrometer and is reported in gigapascals (GPa).

To observe the glassy phases of the thermosets and composites of this invention prepared using polysulfone oligomers, carbon fiber composite and neat matrix samples were thin sectioned at room temperature using a diamond knife. Thin sections (0.6 0.8 micron thick) were stained with RuO4 vapor for four minutes before being examined by a transmission electron microscopy (TEM) to determine morphology.

The procedure used for preparing the sections for transmission electron microscopy examination follows. A sample of the thermoset or composite cut to about a 2×2×10-mm size was placed in a metal chuck and attached to a microtomer (LKB Ultratome V). The sample was prepared for microtoming by first trimming the area to be thin sectioned into the form of a trapezoid using a glass knife. The trapezoidal shaped blockface was less than one millimeter in diameter. The glass knife was replaced with a diamond knife (Sorvall-DuPont) and the trough attached to it was filled with distilled water. As the thin sections ( 600 to 800 Angstroms) were cut, they were floated in a ribbon pattern on the water surface. The sections were picked up using 300-mesh copper grids and allowed to air-dry. The grids containing the thin sections were attached to a glass microscope slide and placed in a staining dish containing 2% aqueous RuO4 (Aesar) for 4 minutes. The glass slide was removed from the staining dish and the slide was placed under a hood to remove the last traces of any RuO4. The stained microtomed sections were examined using a Zeiss EM-10 transmission microscope at 60 KV and electron photomicrographs were taken at 2000× and 5000×, and than enlarged to 6000× and 15,000×, respectively.

The glass transition temperature, dry modulus, and wet modulus values of neat matrix and carbon fiber composite samples were obtained using a Rheometrics Dynamic Spectrometer (RDS). All measurements were made in the temperature sweep mode at a frequency of 10 rad/sec. The strain applied to the torsional rectangular test samples (2.5"×0.5"×0.0125") was kept within 0.2% to insure that the measurements were in the linear viscoelastic range. The tan δ max temperature was defined as the glass transition temperature (Tg) of the sample. Using the above procedures, a distinct Tg for each phase of the matrix is not observed in those cases where the separate phases have Tg's within about 25° C. of each other.

The following Examples illustrate this invention but are not meant as limitations thereof. In these Examples, unless otherwise specified, all parts and percentages are parts and percentages by weight. Molecular weight ($M_n$) values, as reported in the examples, were calculated from end group analysis using the formula $M_n = 2000/meq$, where meq = total milliequivalents of end groups by analyses, unless otherwise indicated.

EXAMPLE 1

Part A

To a 12 liter flask having a nitrogen inlet and equipped with a thermometer, stirrer, condenser and Dean-Stark trap were added under nitrogen 1333 grams (5.8 moles) of bisphenol A, 1420 grams (11.3 moles) of a 44.8% aqueous potassium hydroxide solution and 160 grams of water. The contents of the flask were heated to 60° C. and maintained thereat for ½ hour, at which time a homogeneous mixture was obtained. Next 960 grams of toluene, 200 grams of potassium carbonate and 1900 grams of dimethylsulfoxide were added to the flask and the contents were heated to the reflux temperature (about 120° C.) to remove water as a water-toluene-dimethylsulfoxide azeotrope, 1200 grams of azeotrope being collected. The contents of the flask were cooled to 105° C., a solution of 1887 grams (6.57 moles) of 4,4'-dichlorodiphenylsulfone in 2000 grams of dimethylsulfoxide and 160 grams of toluene was added and the resulting mixture was heated to 160° C. and maintained at 160° C. for 16 hours, toluene distillate being removed, as formed. The reaction mixture was cooled to 120° C.

In a second flask a mixture of 159.4 grams (1.46 moles) of p-aminophenol, 177.5 grams (1.42 moles) of 44.8% aqueous potassium hydroxide solution, 60 grams of water, 240 grams of toluene and 900 grams of dimethylsulfoxide was dehydrated at 120° C. for 4 hours. The dehydrated mixture was transferred to the 12 liter flask under nitrogen and the resulting mixture was heated to 140° C. and maintained at 140° C. for 2 hours, following which time the reaction mixture was cooled to room temperature. The cooled mixture was next filtered to remove the solid inorganic salts and the filtrate was washed with dimethylsulfoxide. The washed filtrate (12 liters) was poured slowly into 48 liters of methanol to precipitate the p-aminophenol terminated polysulfone oligomer as a solid product. The precipitate was then washed with water until free of chloride ions and the washed product was dried under vacuum at 100° C. to give a yield of 94.7% amounting to 2746 grams of oligomer having a melt viscosity (220° C.) of 11,000 poises, a molecular weight ($M_n$) of 4050 by size exclusion chromatography (SEC) and a glass transition temperature, Tg, of 175° C. End group analyses (OH=0.07meq/gram and $NH_2$=0.28 meq/gram) indicated that greater than 74% of the end groups of the oligomer were amine terminated.

Part B

A vessel equipped with agitator and heating means was charged with 40 parts of the p-aminophenol terminated polysulfone oligomer of Part A, above, and 40.8 parts of resorcinol diglycidyl ether (Heloxy 69 marketed by Wilmington Chemical Co.). The charge was heated to 100° C. and agitated for 1.5 hours, following which time 19.2 parts of 4,4'-diamino- diphenylsulfone were added to the charge and agitation was continued for 10 minutes. The vessel was placed in a vacuum oven at 150° C. to remove entrapped air and then the mixture was poured into a preheated (177° C.) aluminum mold (cavity dimensions of $\frac{1}{8}"\times 6"\times 7"$). The mixture was cured in the mold for 2 hours at 177° C. followed by 2 hours at 200° C. under vacuum and then cooled to room temperature at a nominal rate of 1°C./minute. The resulting cured resin was a thermoset having a glass transition temperature, Tg, of 163° C. Mechanical property measurements gave a calculated critical stress intensity factor, $K_{IC}$, of 1.71±0.07 MPam$^{\frac{1}{2}}$, G'($\omega$) of 1.3 GPa and cohesive fracture energy, $G_{IC}$, of 833±68 joules/meter$^2$. Transmission electron microscopy of $RuO_4$-stained microtomed sections of the cured resin indicated a phase separated morphology consisting of a polysulfone oligomer rich continuous phase and a discontinuous phase consisting of elliptical and circular shaped domains of various sizes and having maximum dimensions in the range of 0.5 micron to 4 microns. The discontinuous phase occupied about 55% of the area represented by the sections.

EXAMPLE 2

The procedure of Example 1, Part B was repeated with the exception that the charge contained 40 parts of the oligomer of Example 1, Part A, 21.5 parts of resorcinol diglycidyl ether, 21.5 parts of diglycidyl ether of bisphenol A (DER 332 marketed by Dow Chemical Co.) and 17 parts of 4,4'-diaminodiphenylsulfone. The thermoset resin of this example had a Tg of 185° C., a $K_{IC}$ of 1.55±0.08 MPam$^{\frac{1}{2}}$, G'($\omega$) of 1.32 GPa and a $G_{IC}$ of 674±70 joules/meter$^2$. Transmission electron microscopy of $RuO_4$- stained microtomed sections indicated a phase separation morphology. The continuous phase was rich in polysulfone oligomer and the discontinuous phase consisted essentially of elliptical and circular shaped domains having maximum dimensions in the range of 0.5 to 3.5 microns. About 50% of the area represented by the sections was occupied by the discontinuous phase.

EXAMPLE 3

The procedure of Example 1, Part B was repeated except that the charge contained 40 parts of the oligomer of Example 1, Part A, 21.6 parts of resorcinol diglycidyl ether, 21.6 parts of diglycidyl ether of bisphenol-F (Epiclon 830 marketed by Dainippon Ink and Chemicals) and 16.8 parts of 4,4'-diaminodiphenylsulfone. The thermoset resin of this example had a Tg of 170° C., $K_{IC}$ of 1.80±0.09 MPam$^{\frac{1}{2}}$, G'($\omega$) of 1.28 GPa and $G_{IC}$ of 938±94 joules/m$^2$. The micrograph of $RuO_4$-stained microtomed sections indicated a phase separated morphology, the discontinuous phase of elliptical and circular shaped domains having maximum dimensions in the range of 1-5 microns and occupying about 55% of the area represented by the micrograph.

EXAMPLE 4

The procedure of Example 3 was repeated except that 21.6 parts of the triglycidyl m-aminophenol (Epiclon EXA 4009 marketed by Dainippon Ink and Chemicals) was substituted for the 21.6 parts of the diglycidyl ether of bisphenol F. The thermoset resin had a Tg of 183° C., a $K_{IC}$ of 1.86±0.05 MPam$^{\frac{1}{2}}$, G'($\omega$) of 1.36 GPa and a $G_{IC}$ of 986±53 joules/meter$^2$. The micrograph of $RuO_4$-stained microtomed sections indicated a phase separated morphology. The continuous phase was rich in polysulfone oligomer and the discontinuous phase consisted of elliptical and circular shaped domains having a size less than 3 microns. The discontinuous phase occupied about 50% of the area represented by the micrograph.

EXAMPLE 5

The procedure of Example 1, Part B was repeated except that the charge contained 40 parts of the oligomer of Example 1, Part A, 20.8 parts of resorcinol diglycidyl ether, 20.8 parts of N,N,N',N'-tetraglycidyl methylenedianiline (Araldite MY 720 marketed by Ciba-Geigy Corp.) and 18.4 parts of 4,4'-diaminodiphenylsulfone. The thermoset resin of this example had a Tg of 195° C., a $K_{IC}$ of 1.54±0.06 MPam$^{\frac{1}{2}}$, G'($\omega$) of 1.27 GPa and a $G_{IC}$ of 692±54 joules/meter$^2$. The micrograph of $RuO_4$-stained microtomed sections indicated a phase separated morphology. The continuous phase was rich in the polysulfone oligomer and the discontinuous phase consisted of elliptical and circular shaped domains having a size less than 3 microns. The discontinuous phase occupied about 50% of the area represented by the micrograph.

EXAMPLE 6

The procedure of Example 1, Part B was repeated except that the charge contained 40 parts of the oligomer of Example 1, Part A, 20 parts of resorcinol diglycidyl ether, 20 parts of triglycidyl p-aminophenol (CG 0500 marketed by Ciba-Geigy Corp.) and 20 parts of 4,4'-diaminodiphenylsulfone. The thermoset resin of this example had a Tg of 188° C., a $K_{IC}$ of 1.83±0.12 MPam$^{\frac{1}{2}}$, G'($\omega$) of 1.34 GPa and a $G_{IC}$ of 926±121 joules/meter$^2$. Transmission electron microscopy of RuOhd 4-stained microtomed sections indicated a phase separated morphology. The continuous phase was rich in polysulfone oligomer and the discontinuous phase consisted of elliptical and circular shaped domains having a size less than 5 microns. The discontinuous phase occupied about 50% of the area represented by the sections.

EXAMPLE 7

Part A

The procedure of Example 1, Part A was repeated except that 1500 grams (6.57 moles) of bisphenol A and 2096.5 grams (7.3 moles) of 4,4'-dichlorodiphenylsulfone were used and m-aminophenol was substituted for p-aminophenol. The m-aminophenol terminated polysulfone oligomeric product (2372 grams; 74% yield) had a Tg of 173° C., a melt viscosity at 220° C. of 3000 poises and a molecular weight ($M_n$) of 5100. End group analyses (OH=0.11 meq/g and $NH_2$=0.28 meq/g) indicated that about 72% of the end groups of the oligomer were amine terminated.

Part B

The procedure of Example 1, Part B was repeated with the exceptions that the charge contained 40 parts of the oligomer of Part A, above, 38.5 parts of resorcinol diglycidyl ether and 21.5 parts of 4,4'-diaminodiphenylsulfone, air was removed in a vacuum oven at 180° C., and the aluminum mold was preheated to 180° C. The cured resin of this example was a thermoset having a Tg of 175° C., $K_{IC}$ of 2.30±0.05 MPam$^{\frac{1}{2}}$, $G'(\omega)$ of 1.38 GPa and $G_{IC}$ of 1420±62 joules/meter$^2$. The resin was insoluble at room temperature in jet fuel, Skydrol hydraulic fluid, methylethyl ketone, methylene chloride and water. Transmission electron microscopy of $RuO_4$-stained microtomed sections of the cured resin indicated a two phase morphology. The continuous phase was rich in the polysulfone oligomer and the discontinuous phase consisted of elliptical and circular shaped domains having a size less than 5 microns. The discontinuous phase occupied about 48% of the area represented by the sections.

Part C

The procedure of Example 1, Part B was repeated with the exceptions that the charge contained 40 parts of the oligomer of Part A, above, 34.3 parts of triglycidyl p-aminophenol (CG 0510 marketed by Ciba-Geigy Corp.) and 25.7 parts of 4,4'-diaminodiphenylsulfone, and air was removed in a vacuum oven at 140° C. The cured resin of this example was a thermoset having two Tg(s) of 200° C. and 267°C., $K_{IC}$=1.75±0.05 MPam$^{\frac{1}{2}}$, $G'(\omega)$ of 1.25 GPa and $G_{IC}$ of 907±52 joules/meter$^2$. Transmission electron microscopy of $RuO_4$-stained microtomed sections of the cured resin indicated a two phase morphology. The continuous phase was rich in the polysulfone oligomer and the discontinuous phase consisted of elliptical and circular shaped domains having a size between 0.5 micron and 3.0 microns. The discontinuous phase occupied about 45% of the area represented by the sections.

EXAMPLE 8

A vessel equipped with agitator and heating means was charged with 35 parts of the oligomer of Example 7, Part A and 44.1 parts of resorcinol diglycidyl ether. Agitation was commenced, the charge was heated at 130° C. for 1.5 hours and then cooled to 100° C. and 20.97 parts of 3,3'-diaminodiphenylsulfone were added, agitation being continued at 100° C. until dispersion appeared to be complete. The vessel was then placed in a vacuum oven at 180° C. to remove entrapped air, following which the resulting resin was poured into a preheated (180° C.) aluminum mold and the resin was cured for 2 hours at 177° C. followed by 2 hours at 200° C. under vacuum. The cured resin was a thermoset having a Tg of 180° C., $K_{IC}$ of 2.19±0.02 MPam$^{\frac{1}{2}}$, $G'(\omega)$ of 1.4 GPa and $G_{IC}$ of 1269±23 joules/meter$^2$. Transmission electron microscopy of $RuO_4$-stained microtomed sections of the cured resin indicated a two phase morphology. The continuous phase was rich in the oligomer and the discontinuous phase consisted of elliptical and circular shaped domains having a maximum size less than 4 microns and occupying about 48% of the area represented by the sections.

EXAMPLE 9

Part A

To a reaction flask equipped with thermometer, stirrer, Dean-Stark trap and condenser were added under nitrogen 71.3 grams (0.31 mole) of bisphenol A, 50.5 grams (0.32 mole) of 2,7-dihydroxynaphthalene, 150 grams of a 45% aqueous potassium hydroxide solution and 60 grams of water. Agitation was commenced and the contents of the flask were heated to 60° C. for $\frac{1}{2}$ hour, at which time a homogeneous mixture was obtained.

Next 174 grams of toluene and 25 grams of potassium carbonate were added to the reaction flask and the contents were heated at 90° C. until a solid mass was formed. Next 220 grams of dimethylsulfoxide were added to the reaction flask and the contents heated to the boil to remove water as a water-toluene-dimethylsulfoxide azeotrope. The reaction mass was cooled to 80° C. and a solution of 201.7 grams (0.7 mole) of 4,4'-dichlorodiphenylsulfone in 220 grams of dimethylsulfoxide and 45 grams of toluene was added to the flask. The reaction mass was heated to 160° C. and maintained thereat for 16 hours, toluene being distilled from the mass and removed therefrom. The reaction mass was then cooled to 100° C.

Meanwhile, in a second flask a mixture of 17.03 grams (0.16 mole) of m-aminophenol, 2 grams of potassium carbonate, 19.3 grams of 45% aqueous potassium hydroxide solution, 20 grams of water and 110 grams of dimethylsulfoxide was dehydrated by heating at 120° C. for 4 hours. The dehydrated mixture was transferred to the reaction flask under nitrogen and the resulting mixture heated for 2 hours at 140° C., after which time the reaction mixture was cooled to room temperature and filtered to remove solid inorganic salts. The filtrate was washed with dimethylsulfoxide and the washed filtrate was slowly poured into 1 liter of methanol to precipitate the m-aminophenol terminated polysulfone oligomeric product. The product was washed free of chloride ions with water and then dried under vacuum at 100° C. The product (192 grams, 66% yield) had a Tg of 186° C., and a molecular weight of about 5300. End group analyses (OH=0.08 meq/g, $NH_2$=0.3 meq/g and Cl=less than 0.03 meg/g), indicated that about 80% of the end groups of the oligomer were amine terminated.

Part B

The procedure of Example 1, Part B was repeated except that the charge contained 40 parts of the oligomeric product of Part A, above, 40.9 parts of resorcinol diglycidyl ether and 19.1 parts of 4,4'-diaminodiphenylsulfone. The cured resin was a thermoset having a Tg of 190° C., a $K_{IC}$ of 1.74±0.07 MPam$^{\frac{1}{2}}$, $G'(\omega)$ of 1.36 GPa and a $G_{IC}$ of 863±69 joules/meter$^2$. The photomicrograph of a RuO$_4$-stained microtomed section of the thermoset of this example, is shown by FIG. 1. The photomicrograph indicates a two phase morphology. The dark (electron dense area) of FIG. 1 indicates that the continuous phase is rich in polysulfone oligomer. The light area of FIG. 1 is the discontinuous phase and indicates that this phase consists of elliptical and circular shaped domains. The domains had a mean size of 0.74±0.16 micron and the discontinuous phase occupied 50.5% of the area represented by the photomicrograph.

EXAMPLE 10

Figure 2:
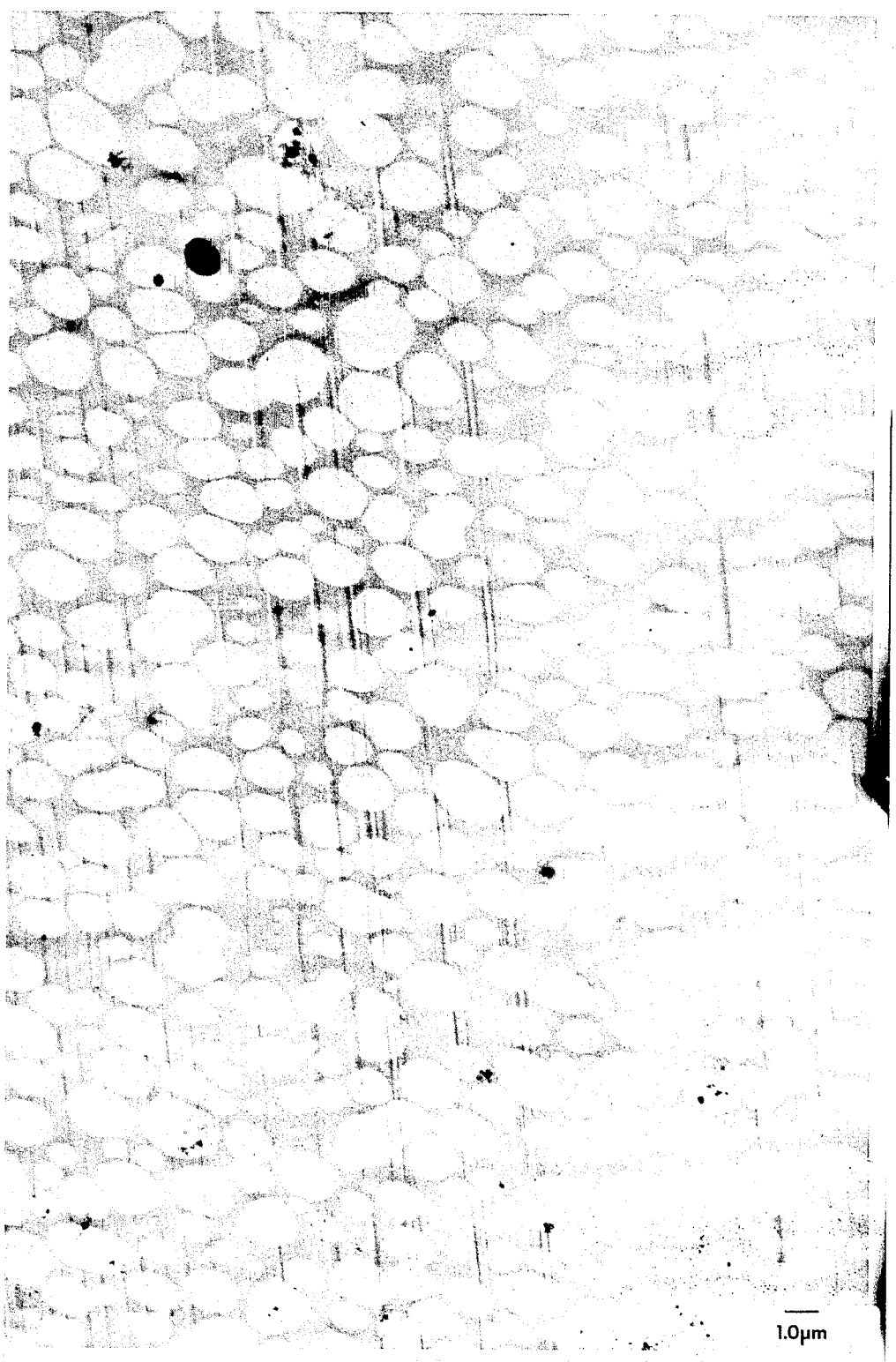

The procedure of Example 9, Part B was repeated except that the charge contained 35 parts of the oligomeric product, 44.1 parts of resorcinol diglycidyl ether and 20.9 parts of 4,4'-diaminodiphenylsulfone. The cured resin was a thermoset having a Tg of 190° C., a K$_{IC}$ of 1.69±0.05 MPam$^{\frac{1}{2}}$, G' ($\omega$) of 1.4GPa and a G$_{IC}$ of 814±48 joules/meter$^2$. The photomicrograph of a RuO$_4$-stained section of the thermoset of this example is shown by FIG. 2 and indicates a two phase morphology. The dark area of FIG. 1 indicates that the continuous phase is rich in polysulfone oligomer and the light area indicates that the discontinuous phase consists of elliptical and circular shaped domains. The domains had a mean size of 1.42±0.31 microns and the discontinuous phase occupied 47.8% of the area of the micrograph.

EXAMPLE 11

Part A

The procedure of Example 9, Part A was repeated except that 50 grams (0.27 mole) of biphenol was substituted for the 50.5 grams of 2,7-dihydroxynaphthalene and 63.1 grams (0.27 mole) of bisphenol A, 173.5 grams (0.60 mole) of 4,4'-dichlorodiphenylsulfone and 15 grams (0.14 mole) of m-aminophenol were used. The oligomeric product (231 grams, 90% yield) was a m-aminophenol terminated polysulfone having a Tg of 181° C., a melt viscosity (220° C.) of 18,000 poises and a molecular weight of 3000. End group analyses (OH=0.07 meq/g and NH$_2$=0.6 meq/g) indicated that about 89% of the end groups were amine terminated.

Part B

The procedure of Example 1, Part B, was repeated except that the charge contained 40 parts of the oligomeric product of Part A, above, 38.6 parts of resorcinol diglycidyl ether and 21.4 parts of 4,4'-diaminodiphenylsulfone. The cured resin of this example was a thermoset having a Tg of 180° C., a K$_{IC}$ of 1.76±0.04 MPam$^{\frac{1}{2}}$, G' ($\omega$) of 1.32 GPa and a G$_{IC}$ of 869±40 joules/m$^2$. The micrograph of RuO$_4$-stained microtomed sections indicated a two phase morphology. The continuous phase was rich in polysulfone oligomer and the discontinuous phase consisted of elliptical and circular shaped domains having a size less than 5 microns. The discontinuous phase occupied about 45% of the area represented by the micrograph.

EXAMPLE 12

Part A

To a reaction flask equipped with stirrer, thermometer, Dean-Stark trap and condenser were added under nitrogen 250 grams (1.1 mole) of bisphenol A, 263.3 grams (2.12) mole of 45% aqueous potassium hydroxide, 50 grams of water, 220 grams of dimethylsulfoxide, 174 grams of toluene and 30 grams of potassium carbonate and the mixture was dehydrated by heating at the reflux for 4 hours to remove water as a water-toluene-dimethylsulfoxide azeotrope. A solution of 279.5 grams (0.97 mole) of 4,4'-dichlorodiphenylsulfone in 220 grams of dimethylsulfoxide and 43.5 grams of toluene was added to the reaction flask and the resulting mixture was heated to 160° C. and maintained thereat for 16 hours, after which time 25 grams of acetic acid were added to the reaction mixture. The mixture was then poured slowly into 1 liter of methanol to precipitate the product. The product was washed free of chloride ions and the washed product dried under vacuum at 85° C. The product (420 grams was a white powder having a melt viscosity (220° C.) of 15,000 poises, Tg of 180° C. and a molecular weight of 3500. The oligomeric polysulfone product was hydroxyl terminated, based on end group analyses (OH=0.57 meq/g).

Part B

A vessel equipped with nitrogen inlet, agitator and heating means was charged with 30 parts of the oligomer of Part A, above, and 44.3 parts of resorcinol diglycidyl ether under nitrogen. Agitation was commenced, the charge was heated to 150° C., 0.74 part of triphenylphosphine (catalyst) was added and agitation was continued for 1 hour while maintaining a nitrogen atmosphere and a temperature of 150° C. Next the temperature of the charge was reduced to 120° C., nitrogen flushing was discontinued, 25 parts of 4,4'-diaminodiphenylsulfone were added and the reaction mixture was agitated for 5 minutes. The vessel was then placed in a vacuum oven at 180° C. to remove entrapped air from the resulting resin mixture, the resin mixture was poured into a preheated (180° C.) aluminum mold, the resin was cured for 2 hours at 180° C. followed by 2 hours at 200° C. under vacuum and the cured resin was cooled to room temperature at a nominal rate of 1° C./minute. The cured resin was a thermoset having a Tg of 160° C., K$_{IC}$ of 1.76±0.05 MPam$^{\frac{1}{2}}$, G'($\omega$) of 1.26 GPa and G$_{IC}$ of 911±52 joules/meter$^2$. Transmission electron microscopy of RuO$_4$-stained microtomed sections of the cured resin indicated a phase separated morphology. The continuous phase was rich in polysulfone oligomer and the discontinuous phase consisted of elliptical and circular shaped domains having a size less than 5 microns. The discontinuous phase occupied about 45% of the area of the sections.

EXAMPLE 13

Part A

The procedure of Example 12, Part A was repeated except that a solution of 345.9 grams (1.2 moles) of 4,4'-dichlorodiphenylsulfone in 220 grams of dimethylsulfoxide and 43.5 grams of toluene was used, and, following heating of the resulting mixture to 160° C. for 16 hours, a sample of the reaction mixture was withdrawn and analyzed for OH content (OH=0.01 meq/g). The reaction mixture was then cooled to 100° C., 54.4 grams (0.44 mole) of 45% aqueous potassium hydroxide was added and the product was heated to 125° C. and maintained thereat for 4 hours. Next the reaction mixture was poured slowly into 1 liter of methanol to precipitate the oligomeric product, the precipitate was washed first with 1% aqueous hydrogen chloride and then with water and the washed product was dried under vacuum at 80° C. The product was a polysulfone oligomer (399 grams, 70% yield) having a Tg of 180° C., a melt viscosity at 220° C. of 10,000 poises and an hydroxyl equivalency=0.47 meq/g.

Part B

The procedure of Example 12, Part B was repeated except that 35 parts of the oligomer of Part A, above was substituted for the 30 parts of the oligomer of Example 12, and 41.2 parts of resorcinol diglycidyl ether were used. The cured resin of this example was a thermoset having a Tg of 176° C., $K_{IC}$ of 1.24±0.05 MPam$^{\frac{1}{2}}$, G'(ω) of 1.36 GPa and $G_{IC}$ of 419±34 joules/meter$^2$. Transmission electron microscopy of RuO$_4$-stained microtomed sections indicated a two phase morphology. The continuous phase was rich in the polysulfone oligomer, and the discontinuous phase consisted of elliptical and circular shaped domains having a size less than 5 microns. The discontinuous phase occupied about 40% of the area of the sections.

EXAMPLE 14

Part A

To a 12 liter reactor equipped with nitrogen inlet, thermometer, condenser and Dean-Stark trap were added 1141.5 grams (5.0 moles) of bisphenol A, 1579.6 grams (5.5 moles) of 4,4'-dichlorodiphenylsulfone, 5060 grams of dimethylsulfoxide, 871 grams of toluene and 760 grams (5.5 moles) of potassium carbonate as a 30% aqueous solution. The reactor was evacuated three times and then the contents were sparged with nitrogen and heated to 80° C., after which time 609 grams of toluene were added. The lower layer of the azeotrope which formed in the trap was removed and the reaction mixture was heated to 150° C. and maintained at 150° C. for 4 hours. Next 140 grams (1.0 mole) of potassium carbonate, 22 grams of toluene and 220 grams of dimethylsulfoxide were added to the reactor and heating was continued for an additional 8 hours, the final temperature being 162° C. A sample, withdrawn from the reaction mixture and precipitated in methanol gave, following washing and drying, a resin having a Tg of 173° C., a melt viscosity at 220° C. of 6000 poises and an hydroxyl equivalency of 0.01 meq/g.

In a second reaction vessel equipped with nitrogen inlet, stirrer, condenser and Dean-Stark trap a mixture of 110.2 grams (1.01 moles) of p-aminophenol, 130 grams (1.01 moles) of 43.6% aqueous potassium hydroxide solution, 130 grams of toluene and 630 grams (500 ml) of tetramethylene sulfone was dehydrated under nitrogen at 160° C. for 5 hours. The dehydrated mixture was transferred to the 12 liter reactor through a cannula, the reactor contents having been cooled to 60° C. Toluene was removed from the Dean-Stark trap and the temperature of the mixture was raised to 163° C. and maintained thereat for 2 hours, following which time the reaction was terminated. A 500 ml sample was withdrawn from the reactor and poured into 5 liters of water containing 100 grams of sodium hydroxide and 5 grams of sodium sulfite to precipitate the resin. The precipitate was filtered, washed free of chloride ions with water and dried. The dried product (105 grams) was a polysulfone oligomer having a Tg of 176° C. and a melt viscosity at 220° C. of 9000 poises, and gave on analysis, OH=0.05 meq/g, NH$_2$=0.38 meq/g and Cl less than 0.03 meq/g. The remainder of the reaction product was recovered in the same manner as above and gave 1940 grams (80% yield) of oligomer having a molecular weight (M$_n$) of 4762 by size exclusion chromatography.

Part B

The procedure of Example 1, Part B was repeated with the exception that the charge contained 35 parts of the oligomer of Part A, above, 41.58 parts of resorcinol diglycidyl ether and 23.42 parts of 4,4'-diaminodiphenylsulfone. The cured resin was a thermoset having a glass transition temperature of 176° C., $K_{IC}$ of 2.01±0.07 MPam$^{\frac{1}{2}}$, $G_{IC}$ of 1134±79 joules/meter$^2$ and G'(ω) of 1.32 GPa. The micrograph of RuO$_4$-stained microtomed sections indicated a two phase morphology. The continuous phase was rich in oligomer and the discontinuous phase consisted of elliptical and circular shaped domains having a size less than 5 microns. The discontinuous phase occupied about 40% of the area represented by the micrograph.

Part C

A resin matrix was prepared by heating with agitation a mixture containing 35 parts of the oligomer of Part A, above, and 41.58 parts of resorcinol diglycidyl ether at 100° C. for 1 hour, cooling the mixture to 80° C., adding 23.42 parts of 4,4'-diaminodiphenylsulfone and continuing agitation for 10 minutes.

The cooled matrix was applied to Hercules MAGNAMITE® AS6 carbon fiber via conventional prepregging techniques and 145 type (areal weight 145 grams/meter$^2$) tapes were made therefrom. Layers of the tapes were assembled into laminates and cured via conventional bag molding/autoclave techniques using a cure cycle of 2 hours at 177° C. followed by 2 hours at 200° C. under vacuum. The fiber volume was 57±2% of the volume of the laminate. Thirty two ply quasiisotropic laminates (4"×6";(+45°/+90°/−45°/0°$_{4s}$) were tested for post impact compression at several impact energies. The test procedure used is described in NASA publication 1092, modified as indicated above. Post impact compression results and other properties of composites formed from the tapes are reported in Table I below.

TABLE I

| MECHANICAL PROPERTIES[1] | |
|---|---|
| Post Impact Compression | ksi |
| Impact Energy (inch-lbs/inch thickness) | |
| 0 | 63.5 ± 1.1 |
| 500 | 63.0 ± 0.4 |
| 1500 | 46.1 ± 3.8 |
| 2500 | 36.9 ± 3.3 |
| Compressive Strength, (0°)$_7$ (ksi) | 206 ± 15 |
| Tensile Strength, (0°)$_6$ (ksi) | 408 ± 28 |
| Tensile Strain (%) | 1.79 ± 0.03 |
| Tensile Modulus (msi) | 23 ± 1 |

[1]Determined at 22.2° C.

What is claimed is:
1. A thermoset comprising a crosslinked epoxy resin matrix with a fracture toughness, $K_{IC}$, of at least 1.0 MPam$^{\frac{1}{2}}$, a Tg of at least 125° C. and comprising a glassy discontinuous phase dispersed in a glassy continuous phase that continues throughout said resin matrix, said discontinuous phase constituting at least about 35 volume % of the total volume of said discontinuous and continuous phases.

2. A thermoset in accordance with claim 1, wherein said matrix contains high strength filaments.

3. A thermoset in accordance with claim 1, wherein said matrix contains carbon (graphite) fiber.

4. A thermoset in accordance with claim 1, wherein said discontinuous phase constitutes between about 45% and about 55% of the total volume of the discontinuous and continuous phases.

5. A thermoset in accordance with claim 1, wherein said continuous phase exhibits a higher electron density than said continuous phase upon staining said matrix with $RuO_4$.

6. A thermoset in accordance with claim 1, wherein said discontinuous phase comprises domains having a largest dimension of between about 0.1 and 5 microns.

7. A thermoset composite comprising a crosslinked epoxy resin matrix containing high strength filaments or fibers, said matrix having a fracture toughness, $K_{IC}$, of at least 1.0 MPam$^{\frac{1}{2}}$ and a Tg of at least 125° C., and comprising a glassy discontinuous phase dispersed in a glassy continuous phase that continues throughout said matrix, said continuous phase exhibiting a higher electron density than said discontinuous phase upon staining said matrix with $RuO_4$ and constituting at least about 35% of the total volume of said discontinuous and continuous phases.

8. A thermoset composite in accordance with claim 7, wherein said discontinuous phase comprises domains having a largest dimension between about 0.1 and 5 microns.

9. A thermoset composite in accordance with claim 8, wherein said discontinuous phase has a volume that is between about 45 and 55% of the total volume of continuous and discontinuous phases.

10. A thermoset composite in accordance with claim 9, wherein between about 40 and 70% of the total volume of said composite comprises carbon (graphite) fibers.

11. A thermoset composite comprising a crosslinked epoxy resin matrix containing high strength filaments or fiber, said matrix having a Tg of at least 125° C., and comprising a glassy discontinuous phase dispersed in a glassy continuous phase that continues throughout said matrix, said discontinuous phase constituting at least about 35 volume % of the total volume of said continuous and discontinuous phases, said composite having a post impact compression value at an impact energy of 1500 inch-pounds per inch thickness of at least about 30,000 pounds per square inch.

12. A thermoset composite in accordance with claim 11, wherein said discontinuous phase comprises domains having a largest dimension between about 0.1 and 5 microns.

13. A thermoset composite in accordance with claim 11, wherein said discontinuous phase has a volume that is between about 45 and 55% of the total volume of continuous and discontinuous phases.

14. A thermoset composite in accordance with claim 11, wherein between about 40 and 70% of the total volume of said composite comprises carbon (graphite) fibers.

15. A thermoset composite in accordance with claim 11, wherein said continuous phase exhibits a higher electron density upon staining said matrix with $RuO_4$.

16. A thermoset composite in accordance with claim 15, wherein said higher electron density is attributable to a polysulfone oligomer.

17. A thermoset composite in accordance with claim 16, wherein said oligomer is concentrated in said continuous phase.

18. A thermoset composite in accordance with claim 17, wherein said continuous phase comprises between about 45 and 55 volume % of the total volume of said continuous and discontinuous phases.

19. A thermoset composite in accordance with claim 18, wherein said discontinuous phase comprises domains that have a largest dimension between about 0.1 and 10 microns.

20. A thermoset composite in accordance with claim 19, wherein said discontinuous phase comprises domains that are spherical or ellipsoidal in configuration.

* * * * *

UNITED STATES PATENT AND TRADEMARK OFFICE
CERTIFICATE OF CORRECTION

PATENT NO. : 4,656,207
DATED : April 7, 1987
INVENTOR(S) : Harold Jabloner, Brain J. Swetlin & Sung G. Chu 1

It is certified that error appears in the above-identified patent and that said Letters Patent is hereby corrected as shown below:

Column 3, line 38 "napthalene"

should read -- naphthalene --

Column 4, line 3 "napthalene"

should read -- naphthalene --

Column 4, line 14 "thio"

should read -- thiol --

Column 4, line 24 "napthalenediol"

should read -- naphthalenediol --

Column 4, line 36 "3,895,094"

should read -- 3,895,064 --

Signed and Sealed this

First Day of December, 1987

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,656,207

DATED : April 7, 1987

INVENTOR(S) : Harold Jabloner, Brain J. Swetlin & Sung G. Chu

Page 2 of 2

It is certified that error appears in the above-identified patent and that said Letters Patent is hereby corrected as shown below:

Column 10, line 59 "CG 0500"

should read -- CG 5010 --

Column 13, line 23 "Figure 1"

should read -- Figure 2 --

Column 13, line 66 "(2.12) mole"

should read -- (2.12 mole) --

Column 16, line 31 "35"

should have been deleted

UNITED STATES PATENT AND TRADEMARK OFFICE
CERTIFICATE OF CORRECTION

PATENT NO. : 4,656,207

DATED : April 7, 1987

INVENTOR(S) : Harold Jabloner, Brain J. Swetlin & Sung G. Chu

It is certified that error appears in the above-identified patent and that said Letters Patent is hereby corrected as shown below:

```
Column 2, line 26 "Ig"

should read -- Tg --

Column 7, lines 1, 7 & 15 "Ig"

should read -- Tg --

Column 10, line 64 "RuOhd 4"

should read -- RuO4 --

Column 15, lines 12 & 64 "Ig"

should read -- Tg --
```

Signed and Sealed this

Tenth Day of May, 1988

*Attest:*

DONALD J. QUIGG

*Attesting Officer*    *Commissioner of Patents and Trademarks*